United States Patent [19]

Naoe et al.

[11] Patent Number: 4,690,744

[45] Date of Patent: Sep. 1, 1987

[54] METHOD OF ION BEAM GENERATION AND AN APPARATUS BASED ON SUCH METHOD

[75] Inventors: Masahiko Naoe, Tokyo; Shozo Ishibashi, Hino, both of Japan

[73] Assignee: Konishiroku Photo Industry Co., Ltd., Tokyo, Japan

[21] Appl. No.: 630,514

[22] Filed: Jul. 13, 1984

[30] Foreign Application Priority Data

| Jul. 20, 1983 | [JP] | Japan | 58-133030 |
| Jul. 20, 1983 | [JP] | Japan | 58-133031 |
| Jul. 20, 1983 | [JP] | Japan | 58-133032 |
| Jul. 20, 1983 | [JP] | Japan | 58-133033 |

[51] Int. Cl.[4] .......................................... H01J 37/08
[52] U.S. Cl. .............................. 204/192.11; 204/192.2; 204/298; 250/398; 250/424; 427/39
[58] Field of Search .................. 156/345, 643, 646; 204/192 N, 192 R, 192 C, 192 EC, 192 S, 192 E, 298; 427/38, 39; 250/398, 424, 427

[56] References Cited

U.S. PATENT DOCUMENTS

| 3,895,602 | 7/1975 | Bobenrieth | 204/298 |
| 4,132,614 | 1/1979 | Cuomo et al. | 204/192 E |
| 4,250,009 | 2/1981 | Cuomo et al. | 204/298 |
| 4,277,304 | 7/1981 | Horiike et al. | 204/298 |
| 4,381,453 | 4/1983 | Cuomo et al. | 204/298 |
| 4,424,104 | 1/1984 | Harper et al. | 204/192 R |
| 4,434,038 | 2/1984 | Morrison, Jr. | 204/298 |
| 4,450,031 | 5/1984 | Ono et al. | 204/298 |
| 4,481,062 | 11/1984 | Kaufman et al. | 204/298 |
| 4,487,675 | 12/1984 | Meckel | 204/298 |

*Primary Examiner*—John F. Niebling
*Assistant Examiner*—Terryence Chapman
*Attorney, Agent, or Firm*—Jordan B. Bierman

[57] ABSTRACT

There is provided a method of ion beam generation wherein a plurality of opposing targets are sputtered by plasma generated in a space confined by these targets and ionized particles thereby generated are led outside of the above space in a given direction under presence of an electric field.

In connection to this method, an ion beam generator is disclosed comprising a plurality of targets, a plasma generating means to generate plasma necessary to sputter these targets in a space confined by these targets and a control electrode to lead ionized particles generated by sputtering with the above plasma outside of such space under control of their energy.

19 Claims, 15 Drawing Figures

METHOD OF ION BEAM GENERATION AND AN APPARATUS BASED ON SUCH METHOD

BACKGROUND OF THE INVENTION

1. Field of the Invention

The present invention relates to a method of ion beam generation and an apparatus based on such method.

2. Description of the Prior Art

The magnetic recording medium, such as the magnetic tape and magnetic disc, has hitherto been widely applied to recording various electrical signals, for example, from video, audio, and digital systems. In a recording system that makes use of the in-plane longitudinal magnetization of a magnetic recording layer formed on a substrate for signal recording, new magnetic materials and new coating techniques have been tested and applied in an effort to improve such medium for higher recording densities. In the meantime, as an alternative approach to improve the magnetic recording medium for higher recording densities, the vertical magnetization recording system that makes use of the magnetization in the direction of the thickness or so-called "vertical magnetization" of the magnetic layer of magnetic recording medium has been proposed, for example, in a journal "Nikkei Electronics", No. 192 as issued on Aug. 7, 1978. This recording system has such a preferable characteristic for high density recording that the demagnetizing field that works on the residual magnetization in the medium decreases as the recording wavelength gets shorter. Being a recording system that is suited to high density recording by nature, it is presently studied for practical applications.

In the above in-plane longitudinal recording system and vertical recording system, it is conceivable to use iron nitride ($Fe_{1-x}N_x$) for a material constituting the recording/reproducing head. As a method to form the $Fe_{1-x}N_x$ film, it has so far been known to sputter an iron target in an atmosphere of mixed gas of argon and nitrogen ($Ar+N_2$) or evaporate iron in an atmosphere of nitrogen gas ($N_2$). However, these methods of known art have not yet been fully investigated on how various relevant parameters are interrelated to one another in defining the condition of depositing the magnetic layer of $Fe_{1-x}N_x$. It is therefore impossible to positively form a magnetic layer of favorable characteristics with good reproducibility by these methods.

OBJECTS AND SUMMARY OF THE INVENTION

Accordingly, it is an object of the present invention to provide a method of preparing a thin film of favorable characteristics with good reproducibility, for example, for the magnetic layer as mentioned above, on the basis of the sputtering method.

It is another object of the invention to provide a method of preparing a magnetic head that is expected to exhibit a high magnetization, low coercive force and high anticorrosive property.

It is another object of the invention to provide a method of preparing a magnetic recording medium having a magnetic layer that is composed of a magnetic material quite different from any magnetic material of known art in composition and structure presenting a high coercive force, high magnetization, and high anticorrosive property.

It is still another object of the invention to provide an apparatus to effectively embody the method of the invention.

Namely, the invention is concerned in a method of ion beam generation wherein plasma generated in a space confined by a plurality of opposing targets is used to sputter these targets to generate ionized particles, which are led outside of the space in a given direction under control of their energy in an electric field.

In addition, the invention is also intended to provide an apparatus to effectively embody the above method in the form of ion beam generator as composed of a plurality of opposing targets, a plasma generating means to generate plasma that is necessary to sputter these targets, and a control electrode intended to lead out the ionized particles generated by sputtering with the above plasma outside of the space confined by these targets under control of their energy.

Other and further objects, features and advantages of the invention will appear more fully from the following description with reference to the accompanying drawings.

DESCRIPTION OF THE PREFERRED EMBODIMENTS

FIGS. 1 to 6 illustrate an ion beam generator embodying the invention to be used in formation of a thin film, for example, made of $Fe_{1-x}N_x$ and its operating principle.

Figure 1:
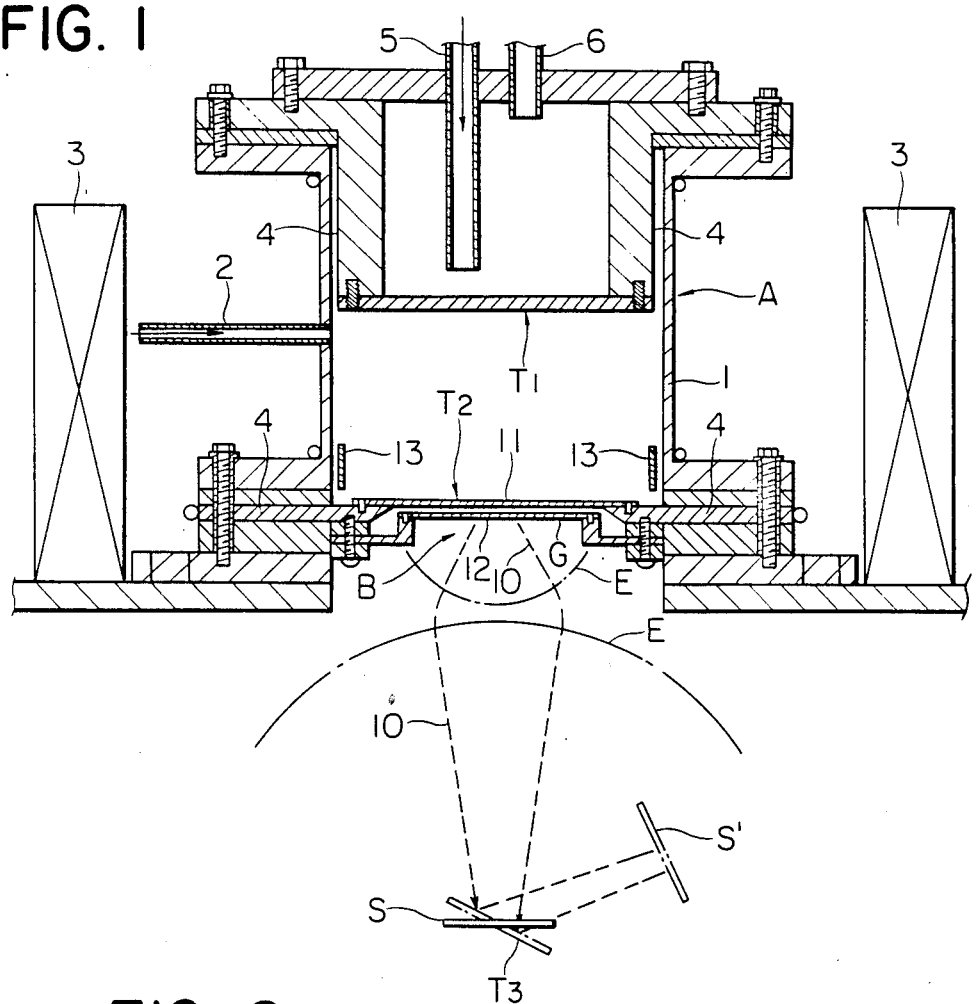
FIG. 1 is a sectional view of an ion beam generator embodying the invention.
Figure 2:
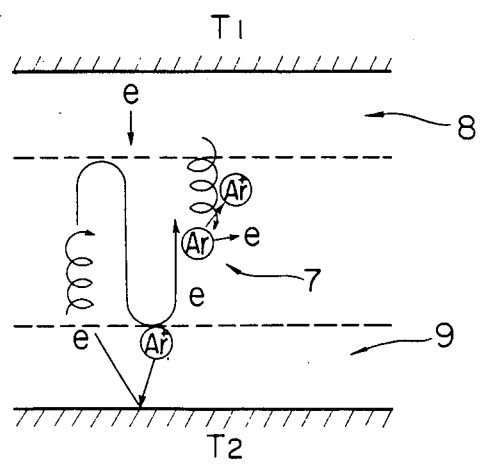
FIG. 2 is a diagram illustrating the principle how opposing targets are sputtered.

The system of FIG. 1 is essentially composed of two sections, the opposing targets sputtering section A and the ion beam outlet section B that leads ionized particles outside of the sputtering section A.

In the sputtering section A, a vacuum chamber 1 is equipped with a gas introducing tube 2, which is used to introduce a gas of given composition (Ar+N₂) in the chamber 1 to set the gas pressure there to about $10^{-3}$ to $10^{-4}$ Torr. The exhaust system of the chamber 1 is omitted from the figure. A pair of target electrodes T1 and T2 made of iron are held by target holders 4 in such positions that they are opposingly disposed in parallel to each other with a gap therebetween. In the space between these targets, there is formed a magnetic field as generated by an external magnetic field generating means 3 which is a magnet coil. Beside the above, a cooling water inlet pipe 5, cooling water outlet pipe 6, and an accelerating electrode 13 appear in the figure.

In the sputtering apparatus as constructed above, a magnetic field is formed perpendicular to the surfaces of opposing targets T1 and T2. As sputtering gas ions are accelerated in electric fields in the cathode drop regions (regions 8 and 9 in FIG. 2, which are regions between the plasma atmosphere 7 and the target T1 and between such atmosphere and the target T2) and collide against the surfaces of these targets, the target material is sputtered by the impact thus given while γ electrons are released from these surfaces. Each of these electrons is driven toward the opposite target and repelled by the cathode drop region in front of such target while being confined in the space between the targets by the magnetic field that presents. γ electrons thus repeat reciprocating motions between the targets T1 and T2 under confinement by the magnetic field.

During such reciprocating motions, these electrons collide against neutral molecules and atoms of the gaseous atmosphere for their ionization. Products of this ionization, ions and electrons in turn further facilitate release of γ electrons from targets and ionization of the atmospheric gas. As a result, plasma of high density is formed between the targets T1 and T2 and therefore there occurs satisfactory sputtering of the target material.

By contrast to other material depositing means, the above opposing targets sputtering system has merits that a film is formed at a higher rate of sputtering and deposition and that the substrate, which is not directly exposed to plasma, can be kept at a lower temperature during film formation.

Figure 3:
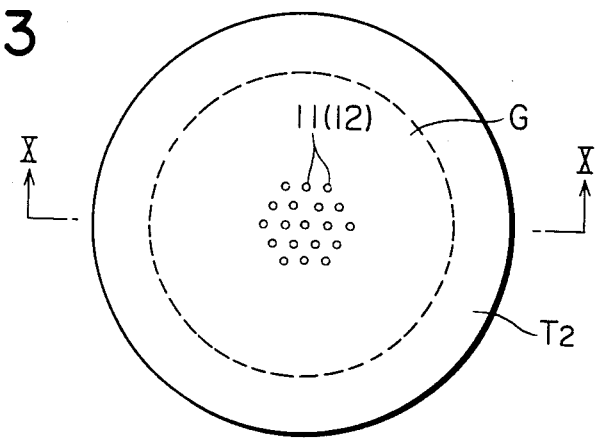
FIG. 3 is a plan view of the target across which an ion beam is led out and a control grid next thereto.
Figure 4:
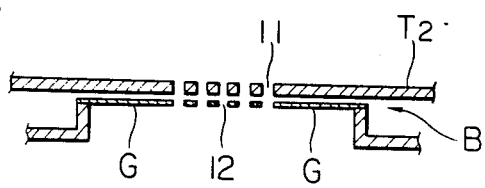
FIG. 4 is a sectional view taken along the line X—X of FIG. 3.

A remarkable structural feature of the system of FIG. 1 is provision of the ion beam outlet section B. As iron that is sputtered from targets in the sputtering section A reacts with the reactant gas N₂ and then ionized, the resultant ionized particles of $Fe_{1-x}N_x$ are led out efficiently in this outlet section B. Namely, this section B has a screen grid G close to the outer surface of the target T2. Both the grid G and target T2 that are maintained at their given potentials have small through-holes 11 and 12, respectively, in corresponding numbers and patterns as illustrated in FIGS. 3 and 4. For example, small through-holes 11 and 12 may be sized 2 mmφ and pitched 5 mm while the grid G be 1 mm thick.

Figure 5:
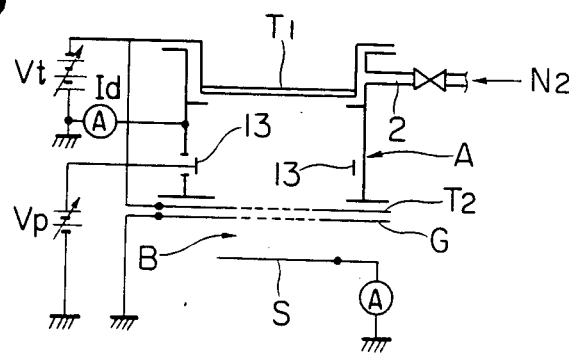
FIG. 5 is a diagram illustrating the electrical circuit configuration of the above apparatus.
Figure 6:
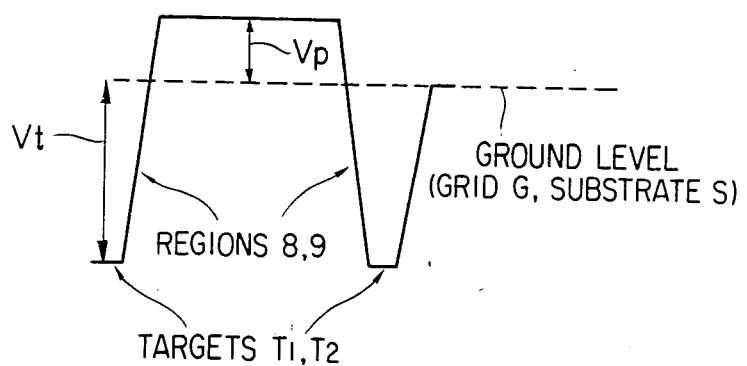
FIG. 6 is a potential distribution diagram over individual parts of the apparatus.

FIG. 5 shows a schematic illustration of an electrical circuit configuration to operate the above system. With the accelerating electrode 13 set at an accelerating voltage of Vp, a negative voltage Vt is applied to both targets T1 and T2 while the grid G is grounded together with a substrate S disposed in the ion beam outlet section B. FIG. 6 shows the potential distribution among individual portions of the circuit system, in which Vp and Vt are set 0 to 200 V and 500 to 1000 V, respectively.

If the above system is operated in the condition as mentioned above, ions in the plasma that are generated in the sputtering section A set to a vacuum of $10^{-3}$ to $10^{-4}$ Torr are accelerated in the cathode drop region 9 (see FIG. 2) by the acceleration electrode 13 in the direction of the target T2. They then pass the small through-holes 11 and 12 as mentioned above while being decelerated in an electric field provided between the target T2 and grid G. They are thus led outside with an energy corresponding to the potential difference between the plasma and substrate S. The ion beam 10 led outside is effectively focused in an electric field E formed in the outlet section B that is set to a vacuum of $10^{-5}$ Torr or less (see FIG. 1). It thus impinges on the surface of the substrate S with the energy as mentioned above. While controling the energy of the ionized particles of $Fe_{1-x}N_x$ depositing on the surface of substrate S by adjusting the anode voltage Vp that is applied to the anode or accelerating electrode 13, therefore, the ion beam 10 can be effectively led outside and directed to the substrate S in an electric field provided by the grid G. Since the chamber where the substrate S is placed is evacuated to a high vacuum of $10^{-5}$ Torr or less, a clean magnetic layer with less impurities can thus be deposited.

It is not preferable that the through-holes 11 and 12 in the target T2 and grid G provided to lead the ion beam outside are made excessively wide, for if they are there will be a leak of unnecessary gas from the sputtering section A to the ion beam outlet section B where the substrate S is placed because of a difference in the gas pressure between these sections, often resulting in higher impurities in the deposited film. Too large through-holes are also unpreferable in view of the mechanical strength of the target T2 and grid G and they may tend to lower the sputtering efficiency because of a reduction in the effective target area.

Figure 7:
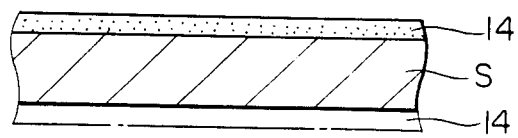
FIG. 7 is a sectional view of a magnetic recording medium embodying the invention.

Using the method and system as explained above, there can be fabricated, for example, as illustrated in FIG. 7, a magnetic recording medium, such as the magnetic tape or magnetic disc, having a magnetic layer of $Fe_{1-x}N_x$ 14, for example, 2000 Å thick on a substrate S. The magnetic layer 14 of this magnetic recording medium is formed suitable either to the in-plane longitudinal magnetic recording or vertical magnetic recording. This layer 14 can be composed of amorphous iron nitride $Fe_{1-x}N_x$. Namely, it is at an amorphous state with no phase separation in its structure, in other words, in a single phase without no grain boundaries. It thus fully satisfies the requirements of the magnetic material of magnetic recording medium as mentioned later though from this point of view the parameter x in the above formula $Fe_{1-x}N_x$ preferably satisfies an inequality $x \geq 0.4$, for with $x < 0.4$ the nitrogen content is not high enough to provide any amorphous state. Further, the magnetic recording medium of FIG. 7 may be composed of a substrate S, for example, made of aluminium, polyethylene terephthalate or the like with a magnetic recording layer 14 formed thereon whose principal component is the above amorphous compound $Fe_{1-x}N_x$. This principal component may substantially account for 100% of the layer or beside the principal component the layer may be loaded with a secondary component or components. Examples of applicable secondary components are metals, such as Ni, Al, Ti, V, Cr, Mn, Cu, W, Pt, Zr, Nb, and Mo, semimetals, such as C, Si, and Ge, and non-metals, such as F, Ne, P, S, As and Se. As already mentioned, the parameter x of the above compound $Fe_{1-x}N_x$ is preferably selected in a range as defined by the inequality $x \geq 0.4$. For example, the compound may have a composition between $Fe_{60}N_{40}$ (x=0.4) and $Fe_{50}N_{50}$ (0.5). Being amorphous iron nitride with no phase separation, this compound $Fe_{1-x}N_x$ exhibits a coercive force Hc=400 to 600 oersted high enough for magnetic recording and also a high saturated magnetization, for example, 12 kgauss. Further, having nitrogen as a component, the compound $Fe_{1-x}N_x$ resists to corrosion superbly.

As shown by the solid line and interrupted line in the magnetic recording medium of FIG. 7, both the surface and back of the substrate S may be provided with a magnetic layer 14 based on the above amorphous iron nitride $Fe_{1-x}N_x$, for example, for use as a magnetic disc.

Figure 8:
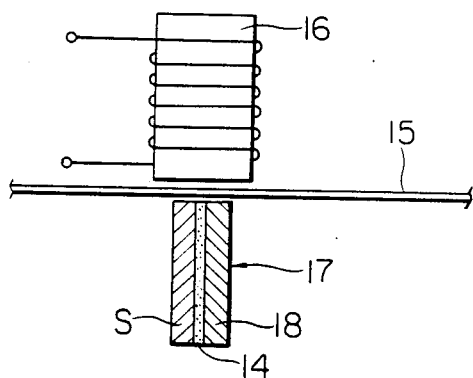
FIG. 8 is a sectional view of a vertical magnetic recording system.

Further, as shown in FIG. 8, the $Fe_{1-x}N_x$ based magnetic layer 14 as mentioned above may be deposited, for example, 2000 Å thick on a glass substrate S as the main magnet 17 that is disposed opposite to the auxiliary magnet 16 as a set-up of recording head to be used in vertical magnetic recording in the magnetic recording medium 15. Particularly, for the magnetic layer 14 of this main magnet 17, $\gamma'$-Fe$_4$N or $\alpha$-Fe+$\gamma'$-Fe$_4$N may be deposited on a glass substrate S and covered by a protective cover 18 which is, for example, a glass plate. It will be evident from the description given later that the magnetic material $Fe_{1-x}N_x$ on which the magnetic layer 14 is based presents a saturated magnetization large enough for signal recording while exhibiting a low coercive force Hc that is required for the magnetic recording head. Therefore, the head with such magnetic layer 14 formed for the permeable layer performs very excellently. Moreover, a high anticorrosive property of the nitrogen containing compound $Fe_{1-x}N_x$ also contributes to improve performances of the head.

In the vertical magnetic recording system attained with this magnetic recording head, the auxiliary magnet 16, as it is energized by the incoming signal to be recorded, generates a magnetic field extending beyond the recording medium 15 concentrating a magnetic flux toward the main magnet 17 in the in-plane direction thereof. Magnetic recording is thus made in the magnetic layer of the medium 15 corresponding to the current magnetization of the main magnet 17.

Figure 9:
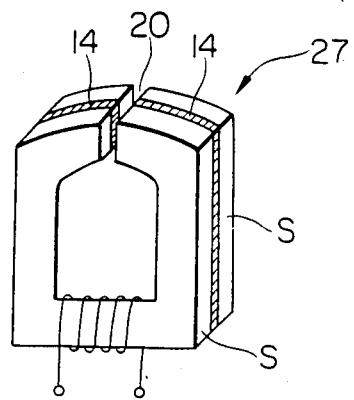
FIG. 9 is a schematic representation of a magnetic head.

FIG. 9 illustrates another magnetic head 27. Also in this head, a magnetic layer 14 based on $Fe_{1-x}N_x$ is formed on both of the end faces of the core S, for example, made of ferrite, which are opposed to each other across the magnetic gap 20 of the core. It is noted that even whole surfaces of the head may be covered with $Fe_{1-x}N_x$ for this purpose. The magnetic heads as mentioned above to which the $Fe_{1-x}N_x$ magnetic material is applied are particularly suitable to high density recording.

Further, the above $Fe_{1-x}N_x$ magnetic layer 14 may be formed to provide magnetic heads other than the above, for example, a thin film head.

This $Fe_{1-x}N_x$ magnetic layer will be further characterized on the basis of some experimental results.

(A) Structure of the $Fe_{1-x}N_x$ Layer

The layer formed was found crystalline though its crystalline structure changed depending on the percentage at which nitrogen gas was mixed, the temperature of substrate Ts and ion accelerating voltage Vp.

Figure 10:
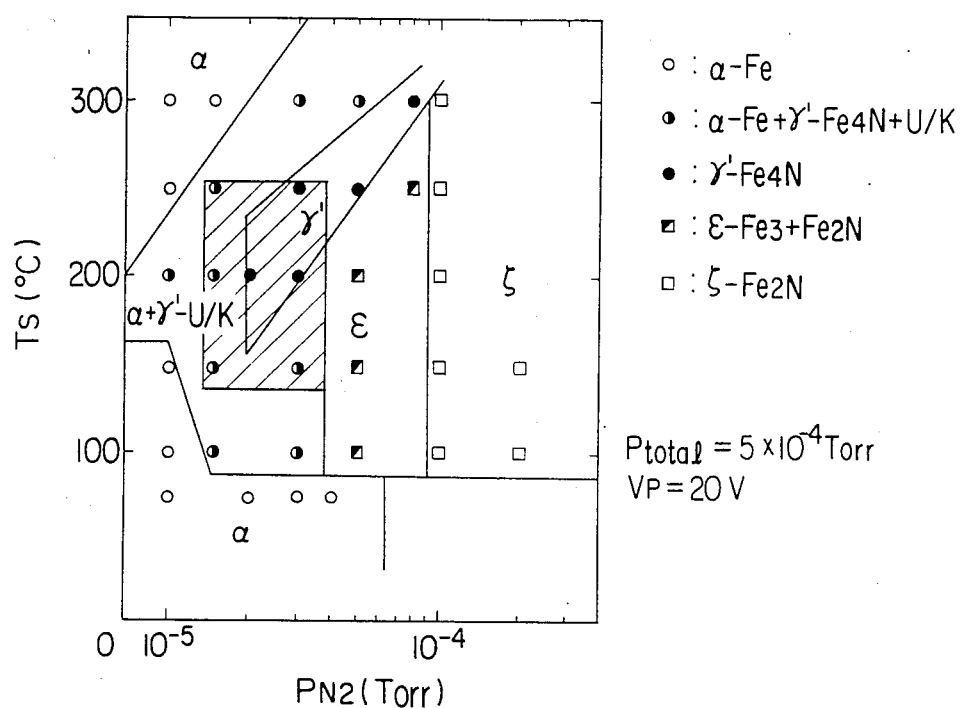
FIG. 10 is a diagram showing how the crystalline structure of a deposited film is determined by the partial pressure of nitrogen gas and the temperature of substrate.

FIG. 10 shows how the crystalline structure of the magnetic layer deposited on the (111) plane of silicon substrate under the total pressure Ptotal=$5 \times 10^{-4}$ Torr and Vp=20 V depended on the partial pressure of nitrogen gas $pN_2$ and Ts. For example, at Ts=200° C. the deposited layer exhibited a higher degree of nitration with an increasing partial pressure $pN_2$, the crystalline phase thereof changing in the following sequence as this parameter increased; mixed phase of $\alpha$-Fe and $\gamma'$-Fe$_4$N, single phase of $\alpha'$-Fe$_4$N, mixed phase of $\epsilon$-Fe$_3$N and $\zeta$-Fe$_2$N, and the single phase of $\zeta$-Fe$_2$N. It is noted that in the mixed phase of $\alpha$-Fe and $\alpha'$-Fe$_4$N, there was found an unknown crystalline phase (U/K) having a spacing of 1.9 to 2.0 Å. As Ts increases above 200° C., boundaries between individual regions shift for higher values of $P_{n2}$. Also below 200° C., a tendency is observed that there is less nitration of deposited film as Ts is lowered. For example, only a single phase of $\alpha$-Fe is formed at Ts=80° C. and $PN_2 \leq 4 \times 10^{-5}$ Torr.

Figure 11:
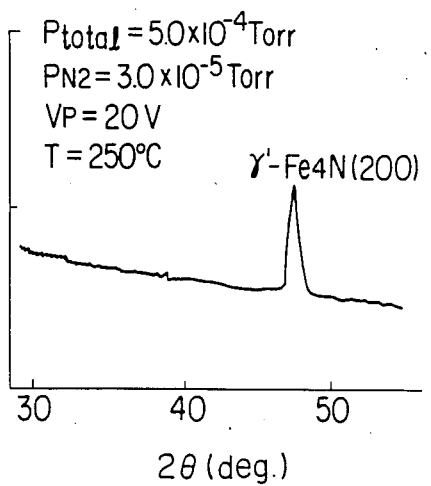
FIG. 11 is an X-rays diffraction diagram of a deposited film.

FIG. 11 is an example of X-ray diffraction patterns observed with $Fe_{1-x}N_x$ magnetic layers as fabricated in various conditions. Among the phases that were formed in these layers, the $\epsilon$-Fe$_3$N and $\zeta$-Fe$_2$N phases presented random orientation of their crystals while the <110>-direction of the $\alpha$-Fe phase of body centered cubic structure and the <100> direction of the $\gamma'$-Fe$_4$N phase of face centered cubic structure showed strong orientation vertical to the layer. It is noted that the $\alpha$-Fe phase and $\alpha'$-Fe$_4$N phase as formed by the conventional sputtering method that makes use of neutral particles alone for deposition exhibit a tendency of orienting their closest packed planes, namely, (110) and (111) planes, respectively, with a decreasing pressure of the gaseous atmosphere. The above results thus suggest that with the ion beam deposition of the present invention a high kinetic energy and uniform orientation of depositing particles might facilitate oriented deposition of the film and that when depositing particles were charged the orientation might occur with respect to a different lattice plane other than the closest packed one depending on the type of compound.

It was further investigated how the X-ray diffraction pattern as observed with the layer deposited under a fixed condition of Ptotal=$5 \times 10^{-4}$ Torr, $PN_2=1.5 \times 10^{-5}$ Torr, and Ts=150° C. changed with Vp. Vp=0 V gave a diffraction spectrum corresponding to the $\alpha$-Fe phase with the (110) plane orientated. By contrast, at Vp=40 V, broad peaks were clearly detected at diffraction angles corresponding to the (111) and (200) planes of $\gamma'$-Fe$_4$N phase. At Vp=60 V, however, the diffraction pattern reduced again to the spectrum corresponding to the (110) plane of $\alpha$-Fe phase alone. These results showed that in the range of Vp=0 to 40 V the proportion of the $\gamma'$-Fe$_4$N phase increased with an increasing Vp. While the $\gamma'$-Fe$_4$N phase of the layer deposited at Vp=40 V and Ts=150° C. was oriented at random, the same phase in the layer previously mentioned that was deposited at Vp=20 V and Ts=200° C. showed orientation of the (200) plane. Since a higher Vp gives a larger kinetic energy to the depositing ions and thereby increases the temperature at the surface of substrate and the mobility of deposited particles there, it is likely that the reaction between the iron and nitrogen may be facilitated by increasing Vp. On the one hand, the results at Vp=60 V suggest a possibility that excessive kinetic energies of the depositing ions might suppress formation of bonds between the iron and nitrogen or these bonds might be formed but then broken as they are hit by other particles. Further, it can be asserted that the orientation in the layer is lowered as high energy particles that are generated under acceleration at a higher Vp hit the substrate.

(B) Saturated Magnetization of the $Fe_{1-x}N_x$ Layer

Figure 12:
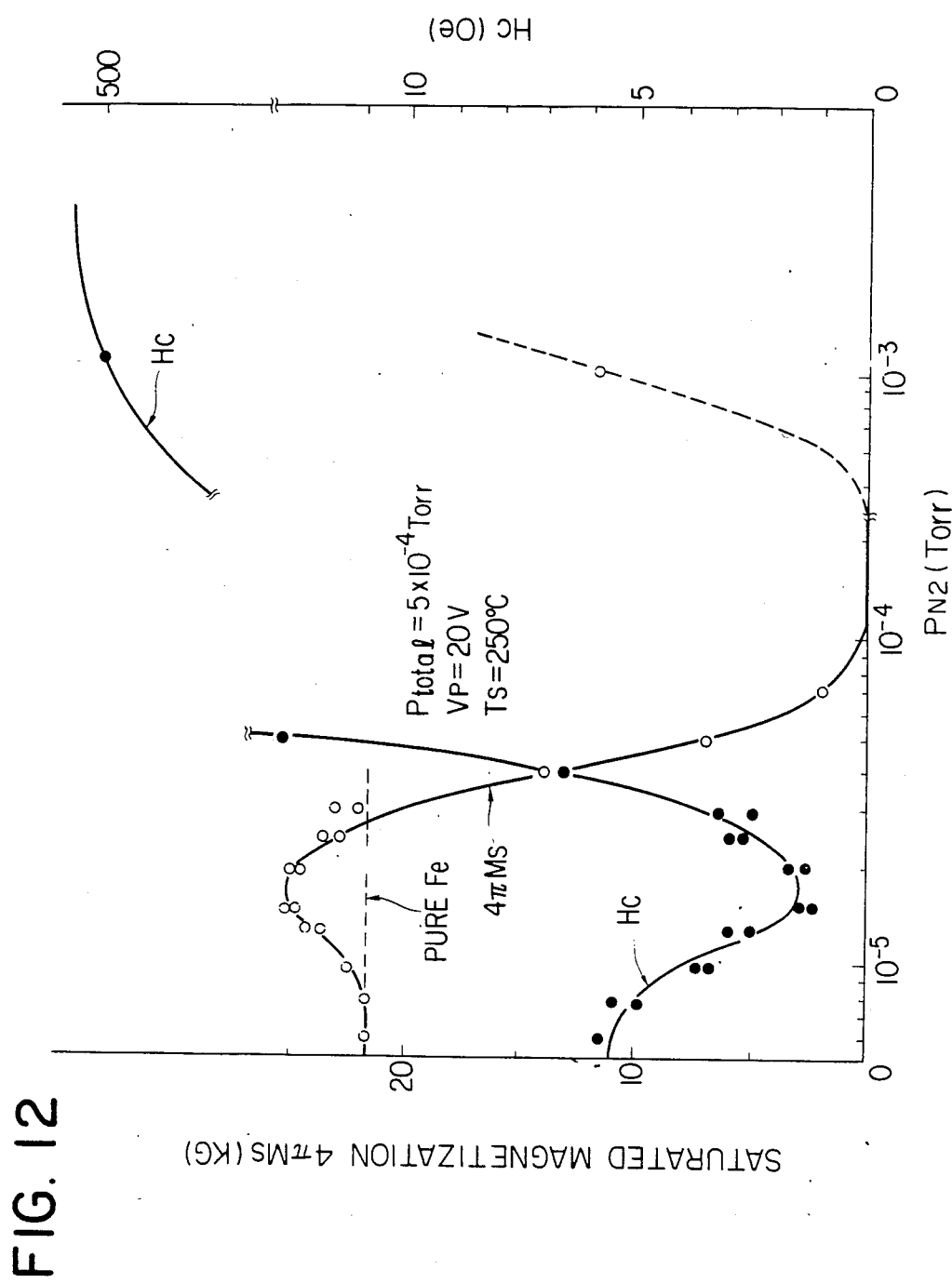
FIG. 12 is curves showing how the saturated magnetization and coercive force of the deposited film depend on the partial pressure of nitrogen gas.
Figure 13:
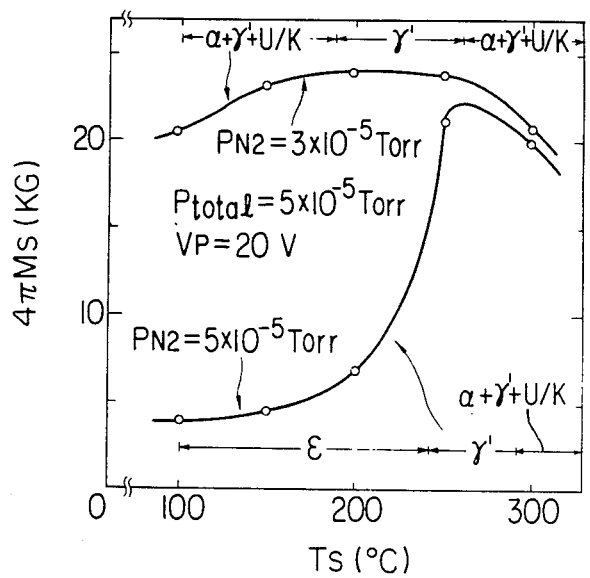
FIG. 13 is curves showing how the saturated magnetization of deposited film depends on the temperature of substrate.

The saturated magnetization $4\pi Ms$ of the layer was determined on a magnetic balance. FIGS. 12 and 13 illustrate how this parameter depended on the condition of deposition. Namely, these figures give curves showing how $4\pi Ms$ of the layer deposited at Ptotal$=5\times10^{-5}$ Torr and Vp$=20$ V depended on $PN_2$ and Ts. In both regions where the deposited layer presented in a mixed phase of $\alpha$-Fe+$\gamma'$−Fe$_4$N+U/K (unknown) and a single phase of $\gamma'$-Fe$_4$N, respectively, the saturated magnetization was higher than that of the pure iron (21.6 kgauss). Particularly, around the boundary between these two regions, it showed a peak of about 25 kgauss. Such high saturated magnetization could be attributed to the presence of the $\gamma'$-Fe$_4$N phase and unknown one. In the diagram of FIG. 10, the hatched area represents the region of such high saturated magnetization. A film of $Fe_{1-x}N_x$ in this region is characterized by a high saturated magnetization and low coercive force Hc, so it performs excellently as a head material. The $\gamma'$-Fe$_4$N phase is reported to exhibit a saturated magnetization of approx. 24 kgauss, which almost corresponds to the values of 22 to 24 kgauss as determined with the single phase of $\gamma'$-Fe$_4$N available in the present invention. The peak saturated magnetization as high as 25 kgauss thus indicates that the unknown phase has a higher saturated magnetization than the $\gamma'$-Fe$_4$N phase. The fact that in the above diagram the deposited layer attains the high saturated magnetization near the boundary between the region of mixed phase of $\alpha$-Fe+$\gamma'$-Fe$_4$N+Unknown and one of single phase of $\gamma'$-Fe$_4$N suggests a possible hypothesis that such unknown phase is composed of Fe$_8$N. At Ptotal$=5\times10^{-4}$ Torr, Vp$=20$ V, and Ts$=250°$ C., a magnetic layer of high saturated magnetization could be fabricated in a range of $PN_2=1.1\times10^{-5}$ to $4.0\times10^{-5}$ Torr (the nitrogen gas mixing ratio $PN_2/Ptotal=2.0$ to 8.0%), while at the same levels of Ptotal and Vp and at $PN_2=3\times10^{-5}$ Torr, a range of Ts$=150°$ to 250° C. also gave a magnetic layer of high saturated magnetization. The present system thus gives a magnetic layer of high saturated magnetization at a substantially wider range of nitrogen gas mixing ratio as compared to the range of $PN_2/Ptotal=2.7$ to 4.0% estimated for the ordinary radio-frequency sputtering system. It is reported that the Fe$_8$N phase that is suspected to comprise the unknown phase of high saturated magnetization is liable to be damaged by bombardment with high energy particles and by elevation of the temperature of substrate. It is therefore noted that in case of ordinary radio-frequency sputtering, as the plasma potential and/or sputtering efficiency change with the mixing ratio of nitrogen gas, there may occur changes in the effect of bombardment with high energy particles and in the temperature of substrate in such a direction that the crystalline growth is disturbed, for example, due to destruction of the quasi-stable state. This narrows the region in which the crystalline growth of high saturated magnetization occurs satisfactorily. By contrast, in the ion beam deposition of the invention, the magnetic layer of high saturated magnetization can be deposited in a wider region, for the mixing ratio of the nitrogen gas can be changed more independently.

An examination of the dependency of the saturated magnetization $4\pi Ms$ on the total pressure Ptotal revealed a tendency that with Ptotal increased the range in which the magnetic layer of high saturated magnetization can be deposited shifts on hotter side. The reason could be that the percentage of depositing particles that was accounted for by ions decreased with an increasing total pressure Ptotal lowering the crystallinity of the magnetic layer formed.

As shown in FIG. 12, the coercive force Hc further increased with an increasing partial nitrogen pressure to a level of 400 to 600 oersted, for example, 500 oersted that is high enough for magnetic recording. It was also found that as the partial nitrogen pressure was increased, the saturated magnetization $4\pi Ms$ dipped once and then increased again up to a desirable level of above 12 kgauss or over. It could be reasoned that as the partial nitrogen pressure $PN_2$ (and the total pressure Ptotal) increased the percentage of depositing particles that was accounted for by ions increased lowering the crystallinity of the deposited film down to the stage of amorphous phase.

Figure 14:
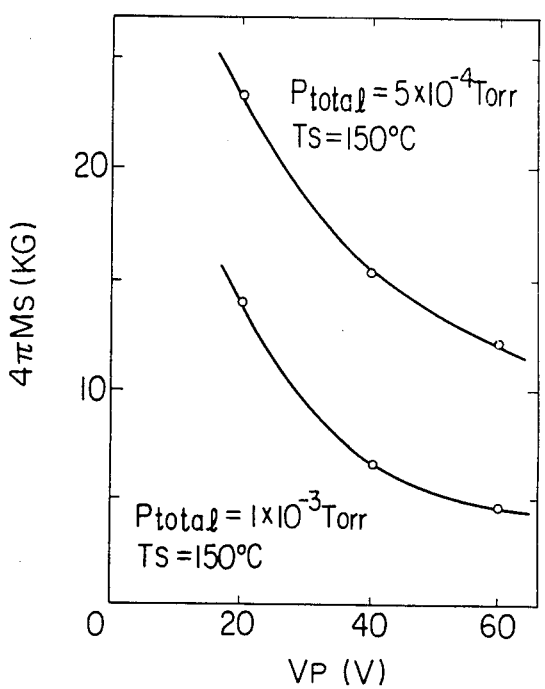
FIG. 14 is curves showing how the saturated magnetization of deposited film depends on the accelerating voltage.

FIG. 14 shows how the saturated magnetization depended on the acceleration voltage Vp. Here, the test samples were prepared either at Ptotal$=5\times10^{-4}$ Torr and Ts$=150°$ C. or at Ptotal$=1\times10^{-3}$ Torr and Ts$=150°$ C. There was a tendency that the saturated magnetization $4\pi Ms$ decreased with an increasing Vp. This finding suggested that the short-distance order in the iron-nitrogen film sharply declined as the energy of depositing particles exceeded the level of 30 eV which corresponded to Vp$=20$ V.

Figure 15:
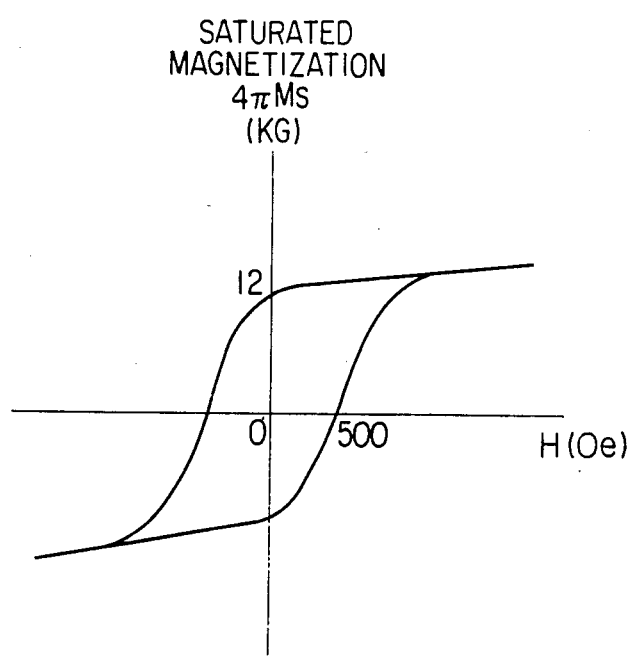
FIG. 15 is a hysteresis loop of the deposited film.

FIG. 15 is a hysteresis curve as estimated when the deposited film was composed of $Fe_{1-x}N_x$ with x$=0.4$ to 0.5 corresponding to the amorphous state. In this case, Hc$=400$ to 600 oersted, for example, 500 oersted was measured on a vibration type magnetometer of known art, thus the coercive force being in a suitable range as the magnetic recording medium.

The above results can be summarized as follows:

(a) By independently controlling the various factors of the depositing condition, it was found that the crystalline structure of the deposited iron-nitrogen film changed depending on the partial nitrogen pressure and the temperature of substrate and this finding led to film formation with good reproducibility.

(b) Among phases available on deposition at the ion acceleration voltage Vp$=20$ V, $\alpha$-Fe and $\gamma'$-Fe$_4$N phases showed a strong orientation of the (110) and (200) planes, respectively, parallel to the film. This orientation could be accounted for by the high kinetic energy, uniform orientation of the depositing particles, and charges they are loaded with.

(c) The film exhibited a saturated magnetization of about 25 kgauss, value higher than that of the pure iron in a region of depositing condition where the crystalline structure underwent a transition from the mixed phase of $\alpha$-Fe+$\gamma'$-Fe$_4$N +U/K (unknown) to the single phase of $\gamma'$-Fe$_4$N.

(d) The temperature range in which the film of high saturated magnetization $4\pi Ms$ could be formed shifted on the less hot side as the total pressure Ptotal declined. They were in a range from 150° to 250° C. at Ptotal $\leq 5\times10^{-5}$ Torr. This finding suggested that even at lower temperatures of substrate the order in the film deposited thereon could be improved by increasing the percentage of depositing particles accounted for by ions.

Among others, the paragraph (a) indicates the good controllability of the ion beam deposition method embodying the invention while the paragraph (d) reveals the effect of the ionization of depositing particles achieved by the same method. They show that a film of high quality that is hard to fabricate by the techniques of prior art can be formed by the present ion beam deposition method, which proves the very high superiority of this method.

Further, it is noted that the nitrogen content of the above $Fe_{1-x}N_x$ gives satisfactorily high resistance to corrosion, another merit of the invention.

It will be evident that various modifications can be made to the described embodiments without departing from the scope of the present invention. For example, in the set-up of FIG. 1, a plurality of grids may be used instead of the single grid G for various control of the ion beam. And various substances can be used as the targets instead of Fe. Meanwhiles, instead of opening small through-holes 11 in the lower target T2, the screen grid or grids as mentioned above can be disposed on one side of the targets T1 and T2 in a direction perpendicular thereto to lead out an ion beam sideways. In the example of the FIG. 1, the $Fe_{1-x}N_x$ film was deposited directly on the surface of substrate S. Instead of the substrate S, however, the third target T3 can be disposed as represented by the dot-interrupted line to bombard it with the ion beam 10 so another ionized particles may be sputtered. These particles are then directed to a substratce S' together with the particles of the above $Fe_{1-x}N_x$ to form a film of a mixed composition between the two. For example, if the permalloy $Ni_{80}Fe_{20}$ is used for the target T3, a magnetic layer composed of a mixture of $Fe_{1-x}N_x$ and permalloy can be formed on the substrate S' while use of niobium for this target gives a magnetic layer composed of $Fe_{1-x-y}Nb_yN_x$ on the same substrate.

In the present invention, as mentioned above, ionized particles that are generated in the sputtering section with the opposing targets system are led out in an electric field or under energy control. Therefore, while generating plasma at a high density to improve the sputtering efficiency, the output ion beam can be accurately controlled by adjusting the pressure of introduced gas and control voltages including the acceleration voltage to always attain desirable characteristics of the deposited film with good reproducibility.

In addition, the iron nitride, if used at least partially for the permeable layer as mentioned above, will give such layer a high magnetization, low coercive force and high anticorrosiveness characteristic of such material, making it possible to provide a head of high performances. Further, the formation of a magnetic layer based on amorphous iron nitride will provide a magnetic recording medium of high performances that are characterized by the high coercive force, magnetization and anticorrosiveness characteristic of the amorphous iron nitride.

What is claimed is:

1. An ion beam generating method comprising generating plasma in a space between a plurality of opposing targets wherein at least one of said targets has first small holes made therethrough, producing ionized particles by sputtering said targets, and leading said ionized particles outside said space in a predetermined direction through said first small holes by controlling the energy of said particles through the use of an electric field.

2. The method of claim 1 wherein said ionized particles are led outside through second small holes made in a control electrode after passing through said first holes.

3. The method of claim 2 wherein said electrode is disposed on at least one of said targets and connected to an electrical potential.

4. The method of claim 1 further comprising directing said ionized particles toward a substrate maintained outside said space after said particles are led outside said space.

5. The method of claim 4 further comprising depositing said ionized particles on said substrate.

6. The method of claim 1 further comprising directing said ionized particles toward an outside target after said particles are led outside said space and producing second ionized particles by spattering said outside target.

7. The method of claim 6 further comprising directing said ionized particles and said second ionized particles toward a substrate and depositing said ionized particles and said second ionized particles on said substrate.

8. The method of claim 1 wherein said targets are composed of iron and further comprising introducing nitrogen gas in said space.

9. An ion beam generator comprising a plurality of opposing targets, a plasma generating means to generate plasma necessary for sputtering said targets in a space confined by said targets, a magnetic field generating means to generate a magnetic field in said space, an acceleration electrode to accelerate ionized particles generated in said space and at least one control electrode wherein said ionized particles, after being accelerated by said acceleration electrode, are led outside of said space through first through-holes made in one of said targets and then passed through second through-holes made in said at least one control electrode to proceed in a given direction under energy control thereof.

10. An ion beam generator as claimed in claim 9 wherein a control electrode is disposed on one side of said targets so ionized particles generated in said space may be led outside thereof across said control electrode under control of the energy of said particles.

11. An ion beam generator as claimed in claim 9 wherein a a substrate is disposed outside of said control electrode to deposit said ionized particles thereon as they are led out.

12. An ion beam generator as claimed in claim 9 wherein said ionized particles are directed from said control electrode to another target and then to a substrate.

13. An ion beam generator as claimed in claim 9 having a gas feeding means to feed said space with nitrogen containing gas wherein one or more of said plurality of targets are composed of iron.

14. An ion beam generating apparatus comprising a plurality of opposing targets, at least one of said targets having a plurality of through-holes, a means for generating plasma for sputtering said targets in a space between said opposing targets to generate ionized particles, and a means for leading said ionized particles outside said space through said through-holes, said leading means also being adapted to control the energy of said particles.

15. The apparatus of claim 14 wherein said means for controlling and leading said ionized particles comprises at least one electrode having through-holes therein.

16. The apparatus of claim 15 wherein said apparatus further comprises a means for generating a magnetic field in said space.

17. The apparatus of claim 16 wherein said apparatus further comprises a means for accelerating said ionized particles generated in said space.

18. The apparatus of claim 15 wherein said electrode is provided on one side of said target having through-holes.

19. The apparatus of claim 14 wherein said apparatus comprises a means for feeding a gas in said space.

* * * * *